US009503133B2

United States Patent
Brown et al.

(10) Patent No.: US 9,503,133 B2
(45) Date of Patent: Nov. 22, 2016

(54) LOW NOISE DETECTION SYSTEM USING LOG DETECTOR AMPLIFIER

(71) Applicant: DockOn A.G., Zurich (CH)

(72) Inventors: Forrest Brown, Carson City, NV (US); Patrick Rada, San Diego, CA (US)

(73) Assignee: DOCKON AG, Zurich (SE)

( * ) Notice: Subject to any disclaimer, the term of this patent is extended or adjusted under 35 U.S.C. 154(b) by 82 days.

(21) Appl. No.: 14/095,973

(22) Filed: Dec. 3, 2013

(65) Prior Publication Data

US 2014/0154991 A1    Jun. 5, 2014

Related U.S. Application Data

(60) Provisional application No. 61/732,848, filed on Dec. 3, 2012.

(51) Int. Cl.
*H04B 3/00* (2006.01)
*H04B 1/10* (2006.01)
*G01F 1/66* (2006.01)
*G01M 3/00* (2006.01)
(Continued)

(52) U.S. Cl.
CPC *H04B 1/10* (2013.01); *G01F 1/66* (2013.01); *G01F 1/663* (2013.01); *G01F 1/667* (2013.01); *G01F 15/063* (2013.01); *G01M 3/00* (2013.01); *G01M 3/243* (2013.01); *H03D 3/002* (2013.01); *H04Q 9/00* (2013.01); *H04Q 2209/40* (2013.01); *H04Q 2209/43* (2013.01)

(58) Field of Classification Search
CPC ............ H04B 3/00; H04B 5/00; H04B 1/10; H04L 25/0272

USPC .............. 375/257, 316, 219, 261; 455/127.2, 455/155.16, 260; 369/47.53
See application file for complete search history.

(56) References Cited

U.S. PATENT DOCUMENTS 2,363,651 A    11/1944 Crosby
2,644,081 A    6/1953 Donald
(Continued)

FOREIGN PATENT DOCUMENTS

EP    0283401 A2    9/1988
EP    1384281 A2    1/2004
(Continued)

OTHER PUBLICATIONS

Insam; "Designing Super-Regenerative Receivers"; Electronic World; Apr. 2002; 19 pages.
(Continued)

*Primary Examiner* — Hirdepal Singh
*Assistant Examiner* — Fitwi Hailegiorgis
(74) *Attorney, Agent, or Firm* — Baker & Hostetler LLP

(57) ABSTRACT

A low noise detection system is disclosed in which a modulator located in a transmitter or a receiver is configured to convert a voltage data signal to a frequency signal, to modulate a baseband signal with the voltage data, and to output the modulated data signal. The receiver further includes a log detection amplifier configured to receive the modulated data signal and to regeneratively demodulate the modulated data signal to extract the data in an amplified analog data signal while not significantly amplifying any noise in the modulated data signal. The receiver further includes a digital conversion circuit for converting the amplified analog signal into a digital data signal.

34 Claims, 12 Drawing Sheets

(51) Int. Cl.
G01F 15/06 (2006.01)
H03D 3/00 (2006.01)
H04Q 9/00 (2006.01)
G01M 3/24 (2006.01)

(56) References Cited

U.S. PATENT DOCUMENTS

| | | |
|---|---|---|
| 3,092,779 A | 6/1963 | De Niet |
| 3,199,031 A | 8/1965 | Harris et al. |
| 3,320,530 A | 5/1967 | Pearman |
| 3,337,807 A | 8/1967 | Brown |
| 3,602,819 A | 8/1971 | Abbott et al. |
| 3,668,535 A | 6/1972 | Lansdowne |
| 3,724,954 A | 4/1973 | Dreyfoos |
| 3,791,272 A | 2/1974 | Nobusawa |
| 3,965,426 A | 6/1976 | Ringland |
| 4,034,298 A | 7/1977 | McFadyen et al. |
| 4,042,883 A | 8/1977 | Rae |
| 4,160,953 A | 7/1979 | Matsuura et al. |
| 4,393,514 A | 7/1983 | Minakuchi et al. |
| 4,510,624 A | 4/1985 | Thompson et al. |
| 4,577,503 A | 3/1986 | Imaino et al. |
| 4,579,005 A | 4/1986 | Brown |
| 4,609,994 A | 9/1986 | Bassim et al. |
| 4,660,192 A | 4/1987 | Pomatto |
| 4,882,768 A | 11/1989 | Obana et al. |
| 4,972,512 A | 11/1990 | Garskamp |
| 4,979,186 A | 12/1990 | Fullerton |
| 1,424,065 A | 7/1992 | Armstrong |
| 5,479,442 A | 12/1995 | Yamamoto |
| 5,621,756 A | 4/1997 | Bush et al. |
| 5,771,026 A | 6/1998 | Stengel |
| 5,789,996 A | 8/1998 | Borodulin |
| 5,818,875 A * | 10/1998 | Suzuki ............... H04L 1/06 329/304 |
| 5,995,814 A | 11/1999 | Yeh |
| 6,035,002 A | 3/2000 | Schleifer |
| 6,054,900 A | 4/2000 | Ishida et al. |
| 6,389,275 B1 | 5/2002 | Kawashima et al. |
| 6,420,937 B1 | 7/2002 | Akatsuka et al. |
| 6,421,535 B1 | 7/2002 | Dickerson et al. |
| 6,518,856 B1 | 2/2003 | Casale et al. |
| 6,538,528 B2 | 3/2003 | Louzir et al. |
| 6,574,287 B1 | 6/2003 | Swaminathan et al. |
| 6,668,165 B1 | 12/2003 | Cloutier |
| 6,668,619 B2 | 12/2003 | Yang et al. |
| 6,670,849 B1 | 12/2003 | Damgaard |
| 6,671,331 B1 * | 12/2003 | Sakuma ............. H04B 17/309 375/316 |
| 7,215,936 B2 | 5/2007 | Sadowski |
| 7,400,904 B2 | 7/2008 | Cornwall et al. |
| 7,423,931 B2 | 9/2008 | Martin et al. |
| 7,567,099 B2 | 7/2009 | Edwards et al. |
| 7,612,616 B2 | 11/2009 | Deng |
| 7,751,857 B2 | 7/2010 | Beumer et al. |
| 7,751,996 B1 | 7/2010 | Ardizzone et al. |
| 7,819,022 B2 | 10/2010 | Hope |
| 7,848,384 B2 | 12/2010 | Pelissier et al. |
| 7,911,235 B2 | 3/2011 | Brown |
| 8,040,204 B2 | 10/2011 | Brown |
| 8,064,864 B2 | 11/2011 | Rofougaran |
| 8,144,065 B2 | 3/2012 | Brown |
| 8,149,173 B2 | 4/2012 | Brown |
| 8,164,532 B1 | 4/2012 | Brown |
| 8,265,769 B2 * | 9/2012 | Denison .................... 607/60 |
| 8,326,340 B2 | 12/2012 | Nalbantis et al. |
| 8,364,098 B2 | 1/2013 | Ridgers |
| 8,368,485 B2 | 2/2013 | Brown |
| 8,385,910 B2 * | 2/2013 | Nazrul ............... H04B 17/0085 455/115.1 |
| 8,462,031 B2 | 6/2013 | Belot et al. |
| 8,542,768 B2 | 9/2013 | Kim et al. |
| 8,644,776 B1 | 2/2014 | Nobbe et al. |
| 8,655,441 B2 * | 2/2014 | Fletcher ............. A61B 5/0002 600/382 |
| 8,676,521 B2 | 3/2014 | Vennelakanti et al. |
| 2001/0037676 A1 | 11/2001 | Chang |
| 2002/0109607 A1 | 8/2002 | Cumeral et al. |
| 2004/0229585 A1 | 11/2004 | Lu et al. |
| 2004/0240588 A1 | 12/2004 | Miller |
| 2005/0003785 A1 * | 1/2005 | Jackson ............... G01S 7/35 455/260 |
| 2005/0009480 A1 * | 1/2005 | Vakilian et al. ........... 455/127.2 |
| 2005/0069051 A1 | 3/2005 | Lourens |
| 2005/0270172 A1 | 12/2005 | Bailey et al. |
| 2006/0028297 A1 | 2/2006 | Kang et al. |
| 2006/0226897 A1 | 10/2006 | Ruijter |
| 2007/0030099 A1 | 2/2007 | Carpentier et al. |
| 2007/0066265 A1 | 3/2007 | May |
| 2007/0105521 A1 | 5/2007 | Granata |
| 2007/0139130 A1 | 6/2007 | Kim et al. |
| 2007/0207749 A1 * | 9/2007 | Rozenblit et al. ......... 455/127.2 |
| 2008/0101185 A1 * | 5/2008 | Rozenblit et al. ......... 369/47.53 |
| 2008/0176529 A1 | 7/2008 | Lau |
| 2008/0269841 A1 | 10/2008 | Grevious et al. |
| 2009/0079524 A1 | 3/2009 | Cyr et al. |
| 2009/0079607 A1 | 3/2009 | Denison et al. |
| 2009/0147837 A1 | 6/2009 | Lau |
| 2009/0322544 A1 | 12/2009 | McDowell |
| 2010/0080270 A1 | 4/2010 | Chen et al. |
| 2010/0152644 A1 | 6/2010 | Pesach et al. |
| 2010/0225417 A1 | 9/2010 | Mistretta et al. |
| 2010/0308999 A1 * | 12/2010 | Chornenky ................ 340/573.1 |
| 2010/0313958 A1 | 12/2010 | Patel et al. |
| 2011/0007844 A1 | 1/2011 | Park et al. |
| 2011/0018777 A1 | 1/2011 | Brown |
| 2011/0037516 A1 | 2/2011 | Nejati et al. |
| 2011/0093220 A1 | 4/2011 | Yang et al. |
| 2011/0212692 A1 | 9/2011 | Hahn et al. |
| 2011/0234316 A1 | 9/2011 | Kim et al. |
| 2011/0301882 A1 | 12/2011 | Andersen |
| 2012/0019336 A1 | 1/2012 | Khan et al. |
| 2012/0106560 A1 | 5/2012 | Gumaste |
| 2012/0112852 A1 | 5/2012 | Manssen et al. |
| 2012/0121030 A1 | 5/2012 | Luo et al. |
| 2012/0164644 A1 | 6/2012 | Neely et al. |
| 2012/0190317 A1 | 7/2012 | Martineau et al. |
| 2012/0280754 A1 | 11/2012 | Gorbachov |
| 2013/0029350 A1 | 1/2013 | Cooper et al. |
| 2013/0059548 A1 | 3/2013 | Umeda et al. |
| 2013/0113666 A1 | 5/2013 | Orsi et al. |
| 2013/0128934 A1 | 5/2013 | Kang et al. |
| 2013/0222058 A1 | 8/2013 | Maniwa et al. |
| 2014/0150554 A1 | 6/2014 | Rada et al. |
| 2014/0171002 A1 | 6/2014 | Park et al. |
| 2014/0266420 A1 | 9/2014 | Brown et al. |
| 2014/0266962 A1 | 9/2014 | Dupuy et al. |
| 2014/0269972 A1 | 9/2014 | Rada et al. |
| 2014/0273898 A1 | 9/2014 | Brown et al. |
| 2014/0287704 A1 | 9/2014 | Dupuy et al. |

FOREIGN PATENT DOCUMENTS

| | | |
|---|---|---|
| GB | 2354329 A | 3/2001 |
| JP | 56-138340 A | 10/1981 |
| JP | 56-138342 A | 10/1981 |
| JP | S60-249436 A | 12/1985 |
| JP | 10-075273 A | 3/1998 |
| WO | WO 00/35124 A2 | 6/2000 |
| WO | WO 02/084782 A2 | 10/2002 |
| WO | WO 2008/018836 A1 | 2/2008 |
| WO | WO 2008/075066 A2 | 6/2008 |
| WO | WO 2012/153147 A1 | 11/2012 |

OTHER PUBLICATIONS

International Patent Application No. PCT/US2014/029832; Int'l Preliminary Report on Patentability; dated Mar. 11, 2015; 7 pages.
U.S. Appl. No. 14/213,529, filed Mar. 14, 2014, Rada et al.
U.S. Appl. No. 14/216,945, filed Mar. 17, 2014, Rada et al.
Sanders B.J.; "Radical Combiner Runs Circles Around Hybrids," MicroWaves; Nov. 1980; vol. 19, No. 12; p. 55-58.

(56) References Cited

OTHER PUBLICATIONS

Caloz et al.;"Metamaterials for High-Frequency Electronics"; Proceedings of the IEEE; vol. 93; No. 10; Oct. 2005; p. 1744-1752.
International Patent Application No. PCT/US2014/029577; Int'l Preliminary Report on Patentability; dated Jun. 19, 2015; 17 pages.

European Patent Application No. 13860466.5; Extended Search Report; dated Jul. 27, 2016; 7 pages.

European Patent Application No. 13859934.5; Extended Search Report; dated Jul. 27, 2016; 9 pages.

* cited by examiner

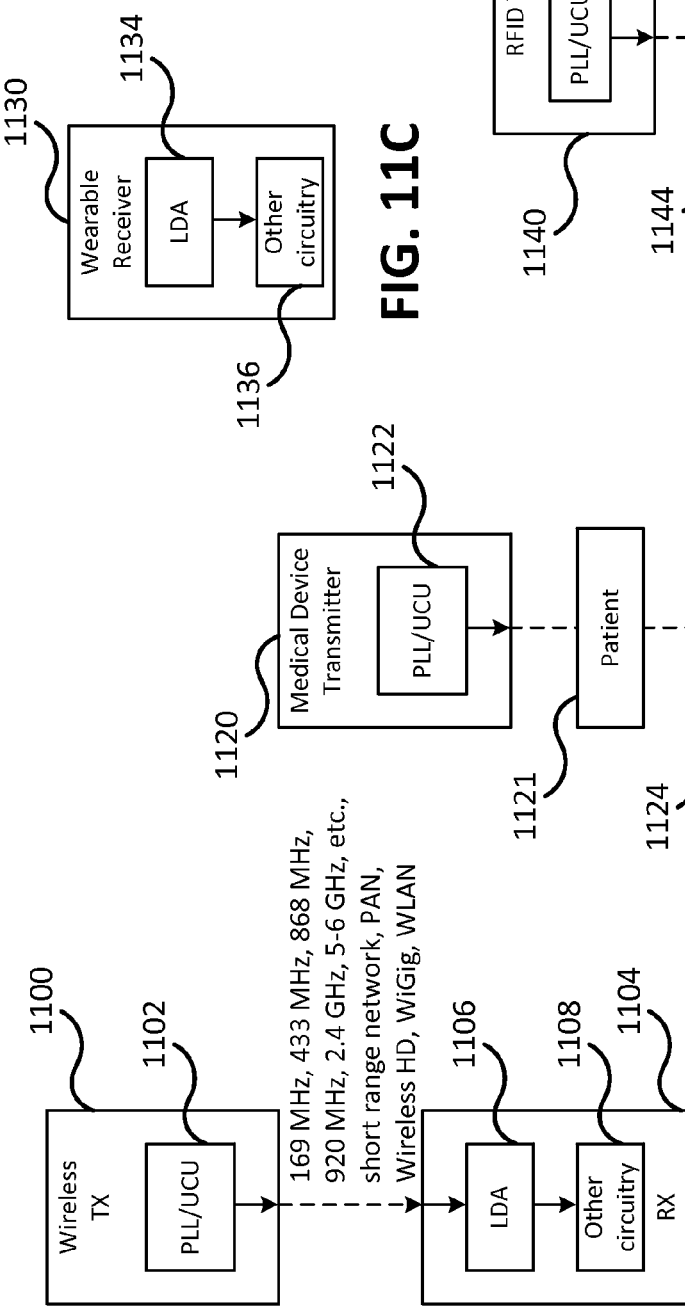
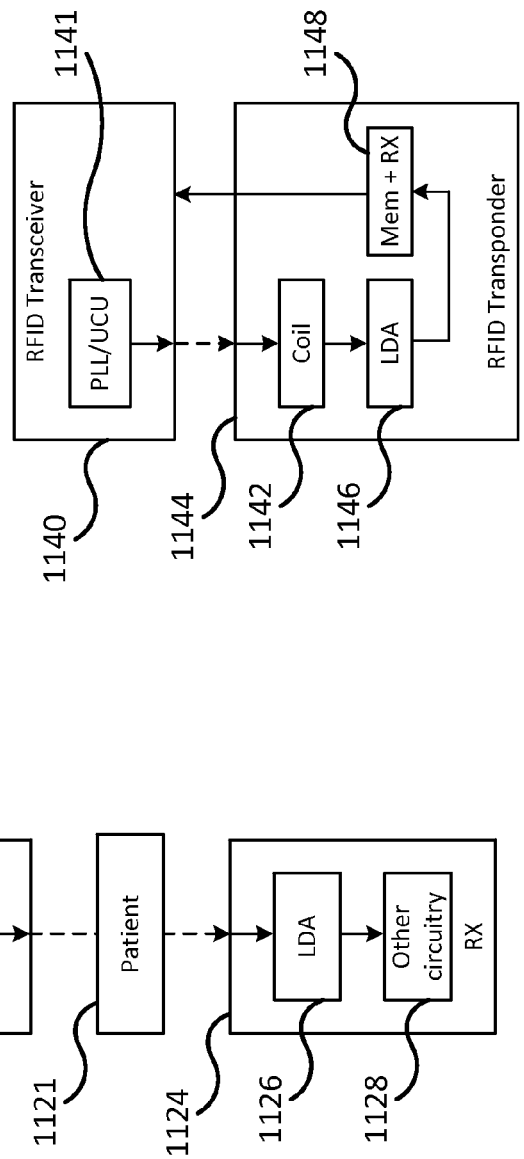
FIG. 11D
FIG. 11C
FIG. 11B
FIG. 11A

LOW NOISE DETECTION SYSTEM USING LOG DETECTOR AMPLIFIER

CROSS REFERENCE TO RELATED APPLICATIONS

This application claims benefit under 35 U.S.C. §119(e) of Provisional Application No. 61/732,848, filed Dec. 3, 2012, the entire contents of which are incorporated herein by reference.

TECHNICAL FIELD

The present disclosure relates to systems and methods for transmitting and receiving signals and particularly for inserting and/or extracting a wanted signal in a noisy signal.

BACKGROUND

Present systems for extracting a wanted signal from a noisy signal include averaging, selective amplification and/or filtering, synchronized detection (e.g., phase lock loop), direct sequence spread spectrum (DSSS) and digital coding.

Averaging reduces noise over n periods, but the wanted signal is not amplified over n periods. Averaging also requires a repetitive signal over n periods, and some type of trigger, and can be problematic at very low signal levels. Selective amplification and/or filtering are frequency dependent and after the setup time do not improve over time in a given bandwidth nor reduce noise within that bandwidth. Selective amplification and/or filtering also have limited noise rejection capabilities. Synchronized detection is limited to a narrow band, is phase locked to the input signal, and is also problematic at very low signal levels. While DSSS spreads the bit energy over a wide frequency spectrum and the recovery of the data dispreads the energy and makes it appear much above the noise floor, DSSS requires the transmitter and the receiver to operate using the same pseudo-noise (PN) sequence. Digital coding, such as Viterbi coding, forward error correction, etc., may increase the signal-to-noise ratio (SNR), but it does so at the expense of reducing throughput data. As a result, there is no satisfactory circuit that enables the detection of a very low signal buried in noise, that enables the regeneration of a repetitive signal, or that increases the signal over noise of the signal in electrical, electronic, telecommunication or wireless applications. The present disclosure discloses a low noise detection system that overcomes these limitations.

SUMMARY

A low noise detection system is described in which a modulator located in a transmitter or a receiver is configured to convert a voltage data signal to a frequency signal, to modulate a baseband signal with the voltage data, and to output the modulated data signal. The receiver further includes a log detection amplifier configured to receive the modulated data signal and to regeneratively demodulate the modulated data signal to extract the data in an amplified analog data signal while not significantly amplifying any noise in the modulated data signal. The receiver further includes a digital conversion circuit for converting the amplified analog signal into a digital data signal.

BRIEF DESCRIPTION OF THE DRAWINGS

FIGS. 11A, 11B, 11C and 11D are block diagrams illustrating different implementations of the low noise detection system described herein.

DETAILED DESCRIPTION OF ILLUSTRATIVE EMBODIMENTS

As will be further described below, the low noise detection/amplification system described herein has many benefits, including high sensitivity, a low noise level (i.e., the noise component of a processed signal has no voltage gain), and high noise rejection, but with low power consumption. Accordingly, the low noise detection system described herein has many applications where noise accompanies a data signal or exists in the transmission environment surrounding a wanted signal. For example, while piezoceramic or piezoelectric sensors can be used in many applications, they generally cannot be used for truly static measurements. Hence, it may be desirable to use an ultrasonic sensor in place of a piezoelectric sensor, but highly noisy environments can make it difficult to impossible to obtain good SNRs with ultrasonic sensors. If ultrasonic sensors could be used in noisy environments, the ultrasonic sensors may be used in applications such as flow metering and leak detection for water, gas and oil, industrial applications where there is a lot of ambient noise, RF interference or reflective projections. A low noise detection system may also enable communication systems to be built using untraditional, noisy mediums for communicating or detecting data, such as the outside of a pipeline as a conductor for communications, which may enable the monitoring of electrical buildup due to liquid flow.

Figure 1:
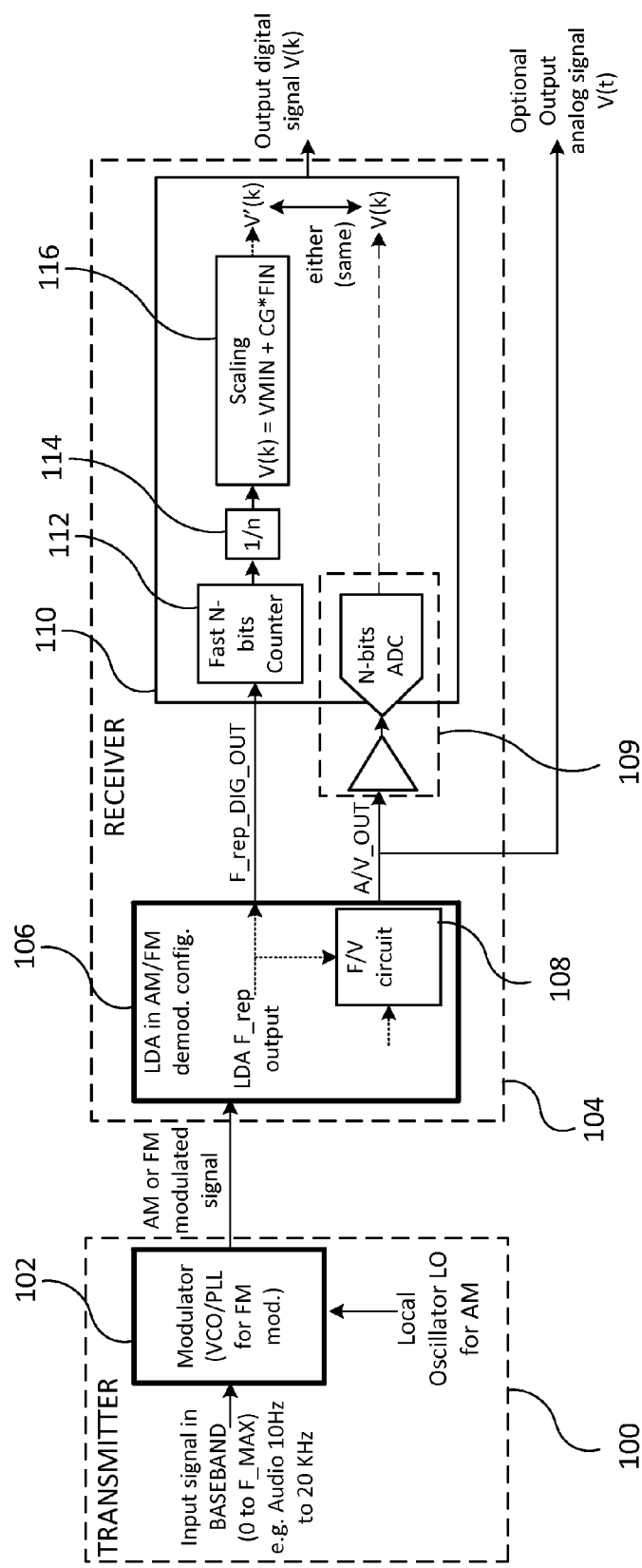
FIG. 1 illustrates an embodiment in which the modulator is installed in the transmitter.

FIG. 1 illustrates an embodiment of a low noise detection system in a high receive sensitivity circuit with either an AM or FM modulated signal. The transmitter 100 includes a modulator 102 that receives an input signal in a baseband frequency (0 to F_MAX), e.g., an audio signal in the 10 Hz to 20 KHz range. For FM modulation, the modulator 102 may include a VCO or a PLL. For AM modulation, the modulator may alternatively receive a local oscillator signal at an intermediate frequency. The resulting AM or FM modulated signal is then transmitted through a medium that is generally lossy and noisy and received by receiver 104, which includes a log detection amplifier 106. Log detection amplifiers (LDAs), also called logarithmic detectors, are described in U.S. Pat. No. 7,911,235, which is incorporated in its entirety herein. Examples of transmission mediums include air, wires, body tissue, liquid, gas, oil, etc. Air wireless propagation may include indoor and outdoor. Outdoor wireless communication suffers generally from heavy loss proportional with the square of the distance in free air (point to point) and more in dense and partitioned environments (i.e., cities), scattering, intersymbol interferences, radiofrequency interferences, and variability of the medium due to other factors, e.g. whether conditions. When in motion, Doppler effect may become a dominant limitation.

Indoor wireless communication suffers generally from heavy loss if not short range, multipath fading, and interferences, and may act as a time variant medium that is modeled generally as a time invariant medium during the time of communication for the sake of simplicity. Attenuation increases rapidly from square law with distance to power 3, 4 or more as the wireless communication crosses one or more walls. Also, there is a significant difference in wood structure buildings, such as in the United States, versus reinforced concrete buildings, such as in much of Europe (range reduction). Multipath fading may be overcome with complex modulations such as orthogonal frequency-division multiplexing (OFDM) by keeping the symbol rate lower than a narrow band communication and multi-input and multi-output (MIMO), which make use of multipath fading.

Wire communication include four families: power line or communication on the grid wires indoor or outdoor, telephone lines, coaxial lines and fiber optics. The last three are impedance controlled lines and provide medium to high losses, limited to high interference/crosstalk and limited to high noise. Power line is more difficult over long range since it is non-controlled, can be medium noisy and include many parallel junctions that create nulls in the communication bandwidth. This is also partially true for telephone lines in residential dwellings.

Body tissues communication suffers heavy losses, high level of artifacts (e.g. motion), and medium to high absorption. EEG, ECG, pulse, cardiac rate, glucose level, ultrasonic, MRI are some of the applications.

Liquid communication suffers heavy losses, medium to high level of noise, limited bandwidth, variability with pressure, temperature, dependency to pipes obstructions and right angles. Applications may include water, oil, gas, air, compressed air, etc.

All in all many of the applications falling in these categories can benefit from high receive sensitivity, increase of signal to noise ratio, low noise amplification, high dynamic range and direct FM, AM demodulation.

The LDA 106 is regenerative in that it builds up a narrow band signal exponentially, when that signal is in-band of the LDA, over n period of the input signal. A significant amount of the random noise in the input signal is accordingly reduced relative to the desired signal. For example, the LDA 106 may recover a signal buried in noise or with a very low level, amplifying the signal by say a factor of 10, without increasing the noise, thereby increasing the SNR, and resulting in at least a 6 dB increase in link budget. The LDA basically operates as follows: One or more resonant circuits are placed around an amplifier to create oscillation. This is the input frequency to the log detector. The amplifier's gain is configured low, as to limit the amount of noise amplified. The log detector discriminates an incoming wanted signal over random noise in that it will pass through the 180 degree phase point of the resonant circuit(s) more frequently than random noise. Thus, energy in the oscillation loop builds faster in the presence of a wanted signal. Once energy in this loop reaches a configurable threshold, oscillation is interrupted or quenched. The frequency of the quenching operation is proportional to the logarithm of the input signal's RMS amplitude. These "quench pulses" contain the demodulated data. In this manner, the log detector provides noise cancellation and the ability to capture a wanted signal from the noise at very low input levels.

The output of the LDA 106, such as F_rep, may be output directly or output to a frequency to voltage converter 108, which reinstitutes the baseband signal, in this case called A/V_OUT, as an optional analog output signal V(t). Furthermore V(t) may be converted in digital from V(t) to V(k) with an analog to digital converter (ADC) circuit 109. In an alternative implementation, the output of the LDA 106 F_rep at intermediate frequency may be converted directly in the digital domain by shaping the pseudo-digital quench pulses in digital, and feeding the digital processing circuit 110 with a N-bits counter 112 with fast clock configured in period-meter, a 1/n digital function 114 to convert the instantaneous period in frequency, and rescaling 116, wherein V'(k)=K1*F(k)+K2, such that either digital output signal is the same after calibration, i.e., V'(k)=K1*F(k)+K2 and is equal to V(k). K1 represents a digital conversion gain in Volt per Hz and K2 a digital constant. For high amplification gain, a high frequency modulator or VCO 102 with high gain, e.g., 500 MHz and gain of 250 MHz/Volt=250 Hz/uV, may be used. It should also be noted that the resolution of the counter 112 is related to its number of bits N' and the full scale (FS) by $FS/(2^{N'})$ (versus the one of the ADC 109 of $FS/(2^N)$ with N bits) and both N & N' should be equal for similar resolution. The clock of the digital period meter may be $2^{N'}$ times the instantaneous period of time F_rep(t) to F_rep(t+1), and F_rep may be at least two time faster than the fastest input signal Vin(t). For example, if the bandwidth of Vin(t) is 20 KHz, Vin(t) full scale 1000 uV, F_rep 50 KHz, and resolution 12 bits, the counter should be clocked at 205 MHz and the resolution would be 0.24 uV.

Figure 2:
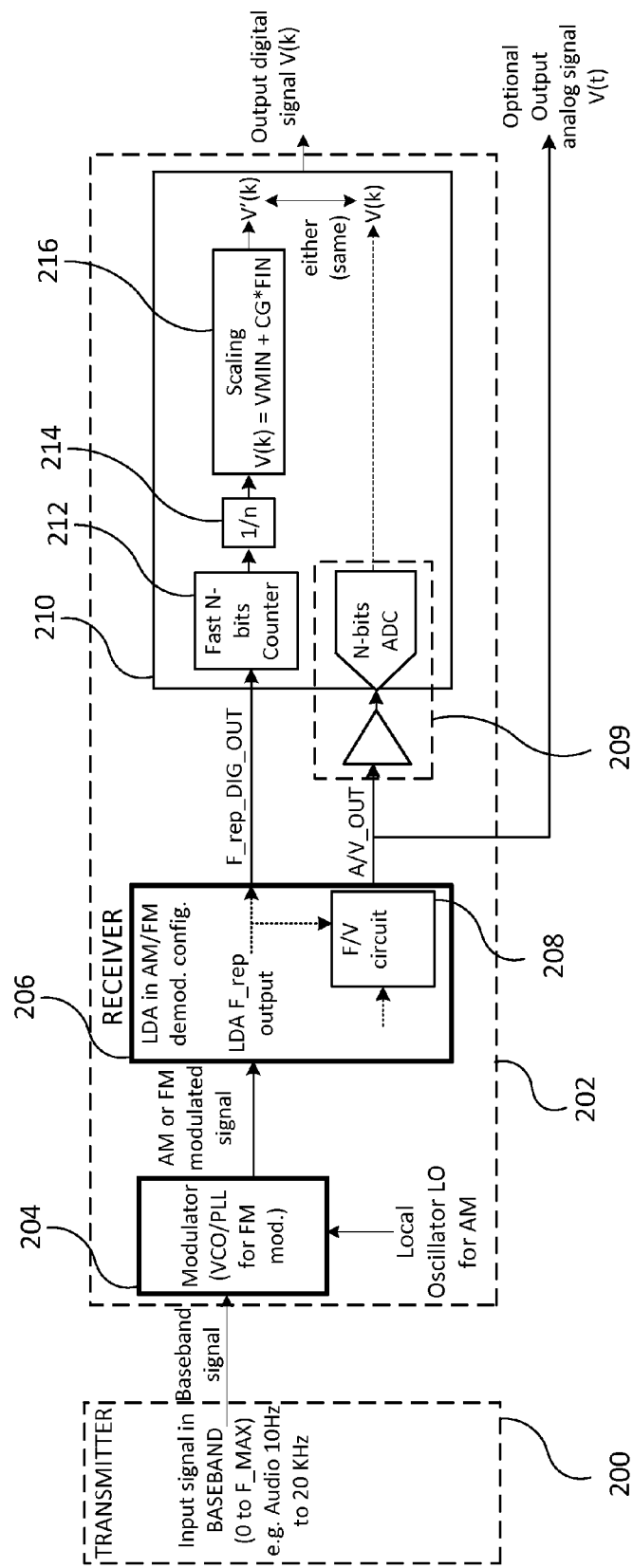
FIG. 2 illustrates an embodiment in which the modulator is installed in the receiver.

FIG. 2 also illustrates an embodiment of a low noise detection system in a high receive sensitivity circuit with a baseband signal. In this embodiment, the transmitter 200 does not include a modulator and just transmits or generates the input signal in a baseband frequency (0 to F_MAX), e.g., an audio signal in the 10 Hz to 20 KHz range. The receiver 202 does, however, include the modulator 204, which receives the baseband signal from the transmitter 200. As with modulator 102, for FM modulation, the modulator 204 may include a VCO or a PLL. For AM modulation, the modulator may alternatively receive a local oscillator signal at an intermediate frequency. The resulting AM or FM modulated signal is then input to LDA 206, which discriminates the AM/FM modulation (demodulates) and provides the F_rep output signal. As in the embodiment of FIG. 1, the F_rep output may be frequency to voltage converted 208, which reinstitutes the baseband signal and output as A/V_OUT, an optional analog output signal V(t). The F_rep output may also be converted from V(t) to V(k) from baseband with analog to digital converter circuit 209 or through digital processing circuit 210 with a N-bits counter 212 and fast clock, a 1/n digital function 214, and rescaling 216 as V'(k), i.e., V'(k)=K1*F(k)+K2=V(k). In this embodiment of FIG. 2, the LDA 206 is used as a preferred means of demodulation and has the characteristic of being able to demodulate concurrently the FM and AM components of the signal. For FM demodulation, this may provide up to 6 dB better discrimination versus conventional FM demodulators.

Figure 3:
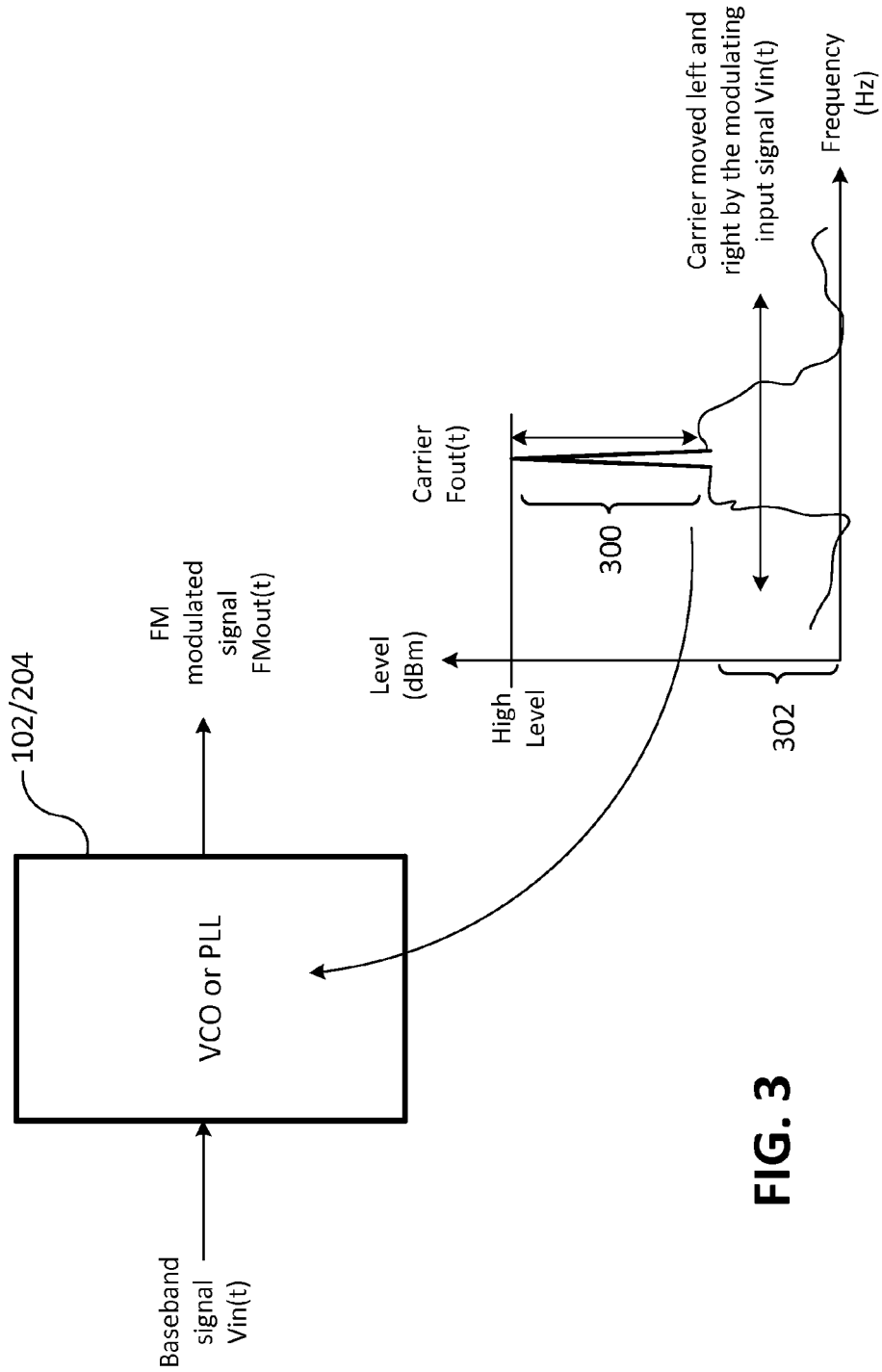
FIG. 3 illustrates an embodiment providing further details of the modulator.

FIG. 3 provides additional detail on the VCO/PLL modulator 102/204 used for frequency conversion for FM microvolt applications. The input microvolt signal is converted directly into an FM modulated signal that results in no voltage/current amplification and little noise contribution because the microvolt signal modulates a clean frequency "tone" 300, moving right and left as input signal Vin(t) does, having about 40 dB high spectral purity before it gets wider and reaches the wider bottom of the tone and down to the noise floor 302. Since this FM signal with high purity feeds the LDA 106/206 with high level and well into its dynamic range, the FM modulated signal is processed with little addition of noise.

Figure 4:
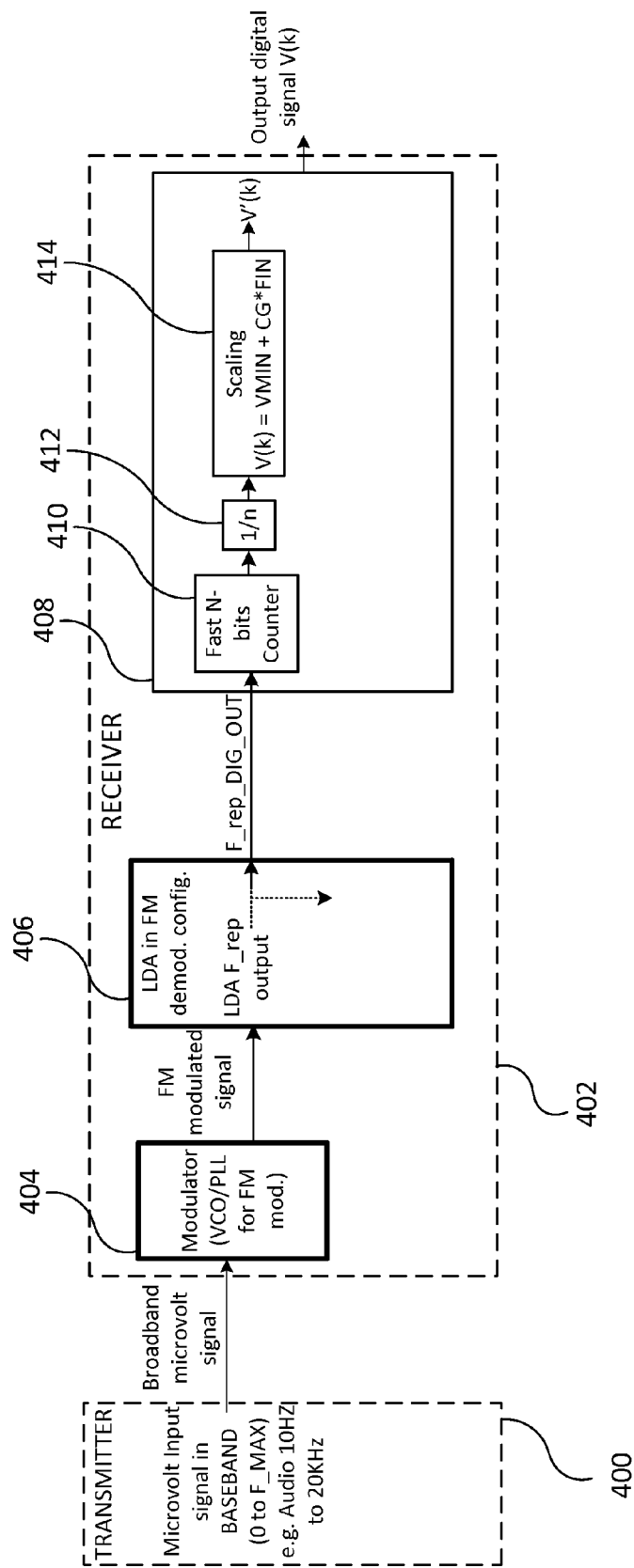
FIG. 4 illustrates a preferred embodiment of a microvolt application.

Microvolt applications, where it may be desirable to achieve a high overall signal gain, without voltage amplification and with minimal noise addition, may benefit greatly from the present disclosure. FIG. 4 is an illustration of a preferred embodiment of the low noise detection system of the present disclosure utilized in a microvolt application where the LDA operates as a low noise, high receive sensitivity circuit.

The embodiment illustrated in FIG. 4 is essentially the same as that illustrated in FIG. 2, but without any optional AM modulation, without any optional analog output and no ADC conversion of the LDA output signal. The transmitter 400 transmits a microvolt signal in a baseband frequency (0 to F_MAX), e.g., an audio signal in the 10 Hz to 20 KHz range. The receiver 402 includes a VCO/PLL modulator 404, which receives the baseband microvolt signal and outputs an FM modulated signal to the LDA 406. The LDA 406 discriminates the FM modulated signal and provides the F_rep output signal. The F_rep output may be converted from V(t) to digital V(k) through digital processing circuit 408 with a N-bits counter 410 and fast clock, a 1/n digital function 412, and rescaling 414 as V'(k), i.e., V'(k)=K1*F(k)+K2.

Some key differences between the topologies of FIG. 1 and FIG. 2 are further defined below. In FIG. 1, a medium of generally high attenuation and high noise level occurs between the transmitter 100 and receiver 104 for the signal passing through the medium as disclosed above. Also, the modulator 102 modulates the signal before passing through the medium. In that configuration, the LDA 106 in the receive section can directly handle the signal and acts mostly as a regenerative device that increase the SNR, amplify signals with high sensitivity, reduce the noise within the bandwidth, over a high dynamic range and provide bandwidth selectivity, thereby reducing out band interferences. An example is an ultrasonic flow meter where the input signal is modulated in the transmitter 100, passed through the medium (water) suffering important losses, but gather information changes, and then be amplified and regenerated with very low noise in the receiver 104 with the LDA 106. In comparison, in the topology in FIG. 2, the baseband signal generated in the transmitter 200 is passed directly through the medium and modulated in the receiver 202 with the use of the PLL or VCO or AM modulator 204. There is no voltage gain, but conversion gain in frequency with significantly lower noise. In this embodiment, the LDA 206 acts a concurrent FM and AM demodulator that increases discrimination by up to 6 dB versus conventional FM demodulators and adds not significant additional noise because of the ideal condition of the input level. An example is a water leak meter where a microvolt baseband audio signal is read from a sensor, directly modulated without significant noise and without voltage gain and further processed by the LDA with minimal noise.

Figure 5:
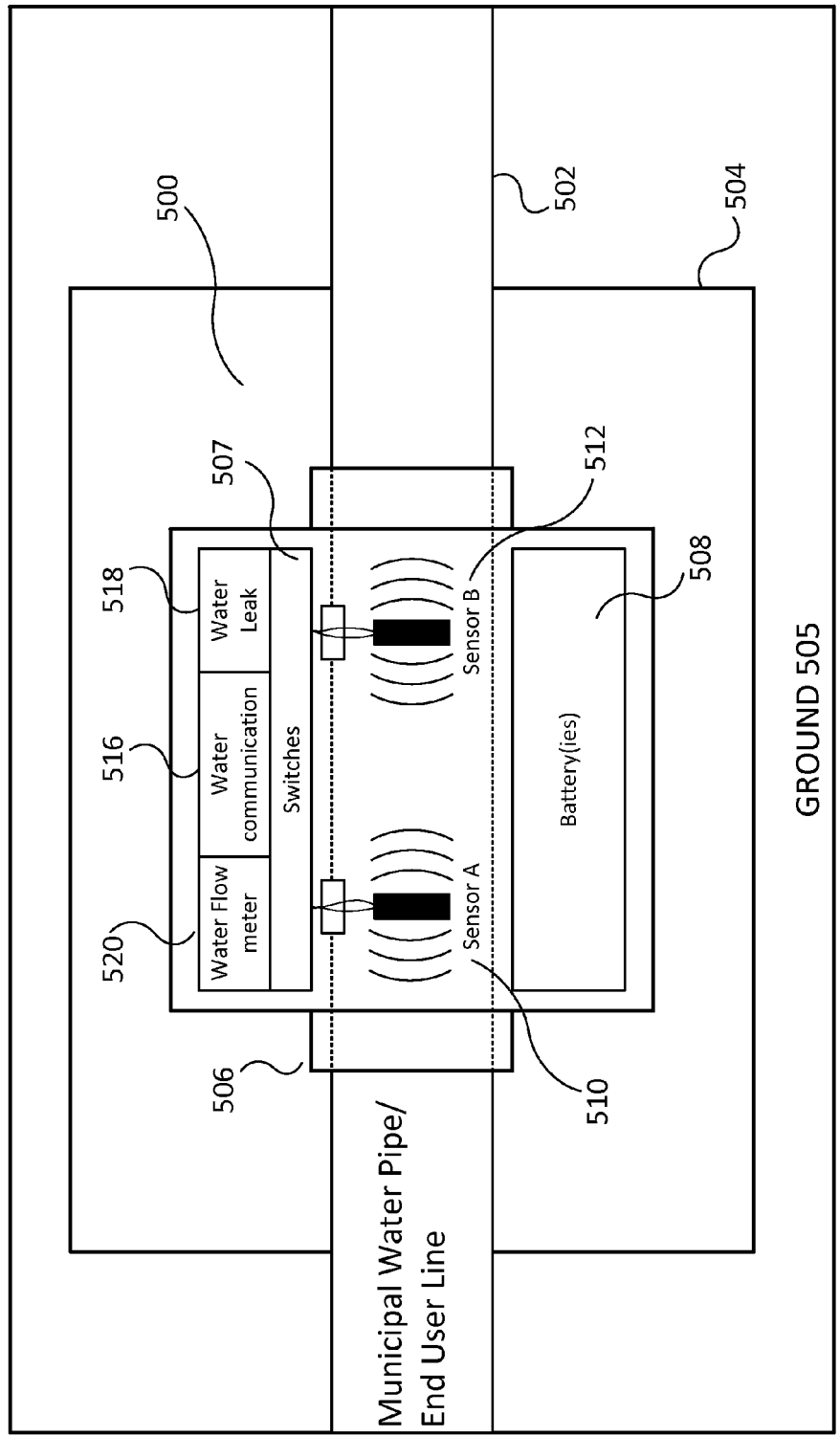
FIG. 5 illustrates an embodiment of an implementation in a water leak detector.

FIG. 5 illustrates one embodiment of an implementation of the low noise detection system of the present disclosure. The implementation is for a water leak detector for use in municipal water pipes that uses one or more acoustic sensors or detectors. The acoustic detectors may operate in transmit (TX) and receive (RX) mode, or just RX mode. In RX mode, the sensor may include one or more hydrophones (immerged acoustic microphone) or piezoelectric crystals that generate a voltage when force, such as sound or pressure, is applied to them. The TX mode may address calibration for the water leak detector or other applications such as water flow meter. In TX mode, the hydrophone or piezoelectric crystals of the sensor may change size when a voltage is applied across them causing them to oscillate at very high frequencies, thereby producing sound waves, e.g., 10 Hz to 10 KHz. The exemplary leak detection device 500 may be installed on a pipe 502 running through a typical pit 504 dug into the ground 505. Typical embodiments of leak detectors rely on sensors mounted on the outside of the pipe connected to an antenna mounted on a lid of the pit for transmission of data to some type of relay or other central monitoring device. Such leak detectors tend to have lower performance and a short transmission range. In the illustrated embodiment, pipe 502 is cut and the detector unit 500 is installed in the line of the pipe 500 by joints 506 on either side of the unit 500 to the pipe 502. The unit 500 integrates as much hardware as possible into a hardware unit 507, including the battery/batteries 508 for powering the unit 500, one or more sensors, such as a leak detection sensor 510 and a receive/transmit sensor 512, one or more switches 514 for controlling the sensors 510/512, a water leak detector 518, and a water communication controller 518. The unit 500 may also include a water flow meter 520, as further described below. The leak detection sensor 510 may be acoustic, hydrophone, piezoelectric or ultrasonic sensor that is placed inside the water line 502, which uses longitudinal sonic waves for best range and sensitivity. Voltage signals generated by the sensors may be processed by the water leak detector 218 and resulting data may be communicated by the water communication controller 518, each of which may include LDA circuitry for high sensitivity and low noise operation as further described below with reference to FIG. 6.

Figure 6:
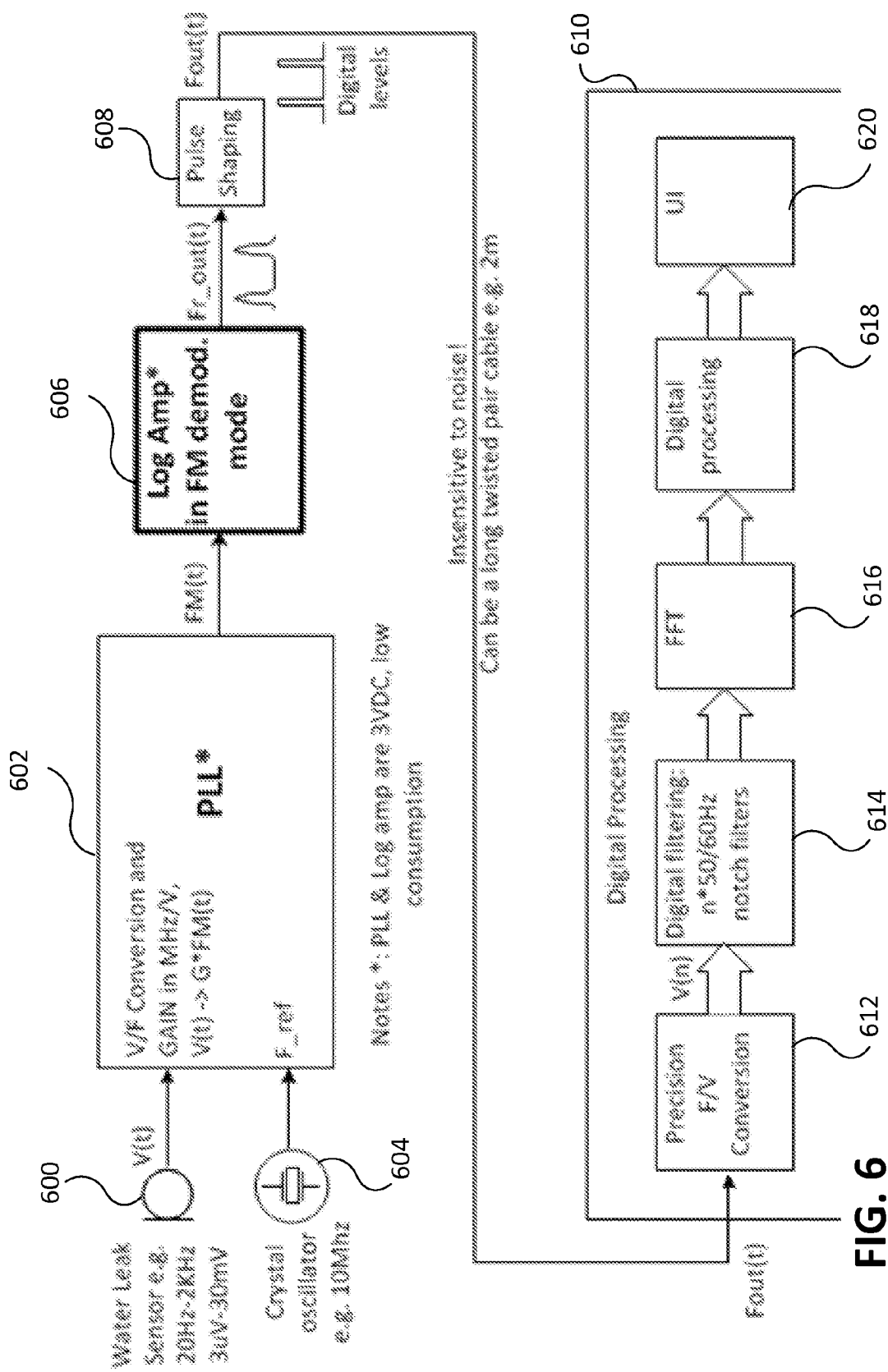
FIG. 6 illustrates a first embodiment of a block schematic diagram for the water leak detector of FIG. 5.

FIG. 6 illustrates a water leak sensor 600 operating at a range of 20 Hz to 2 KHz and outputting a voltage signal between 3 uV to 30 mV providing an input signal V(t) to PLL 602. Without amplifying the input voltage signal, and using a crystal oscillator 604 to supply an F_ref signal, PLL 602 converts the voltage signal to a modulated frequency signal FM(t). The LDA 606, receives a FM signal with high power level from the PLL 602, demodulates the FM modulated signal much above noise, gets the data signal with minimal additional noise, and outputs an amplified pulse signal Fr_out(t), which is then pulse shaped 608 to generate an digital level output signal Fout(t) that is insensitive to noise and may be readily transmitted to other digital processing circuitry 610 over short connection or rather long connection such as a twisted pair cable up to 2 meters long. The PLL and LDA are not power hungry and only require about 3 VDC. Digital processing circuitry 610 may convert 612 the frequency signal back to voltage, perform digital filtering 614, apply a fast Fourier transform (FFT) 616, and other digital processing 618 to generate output data via a user interface (UI) 620.

Figure 7:
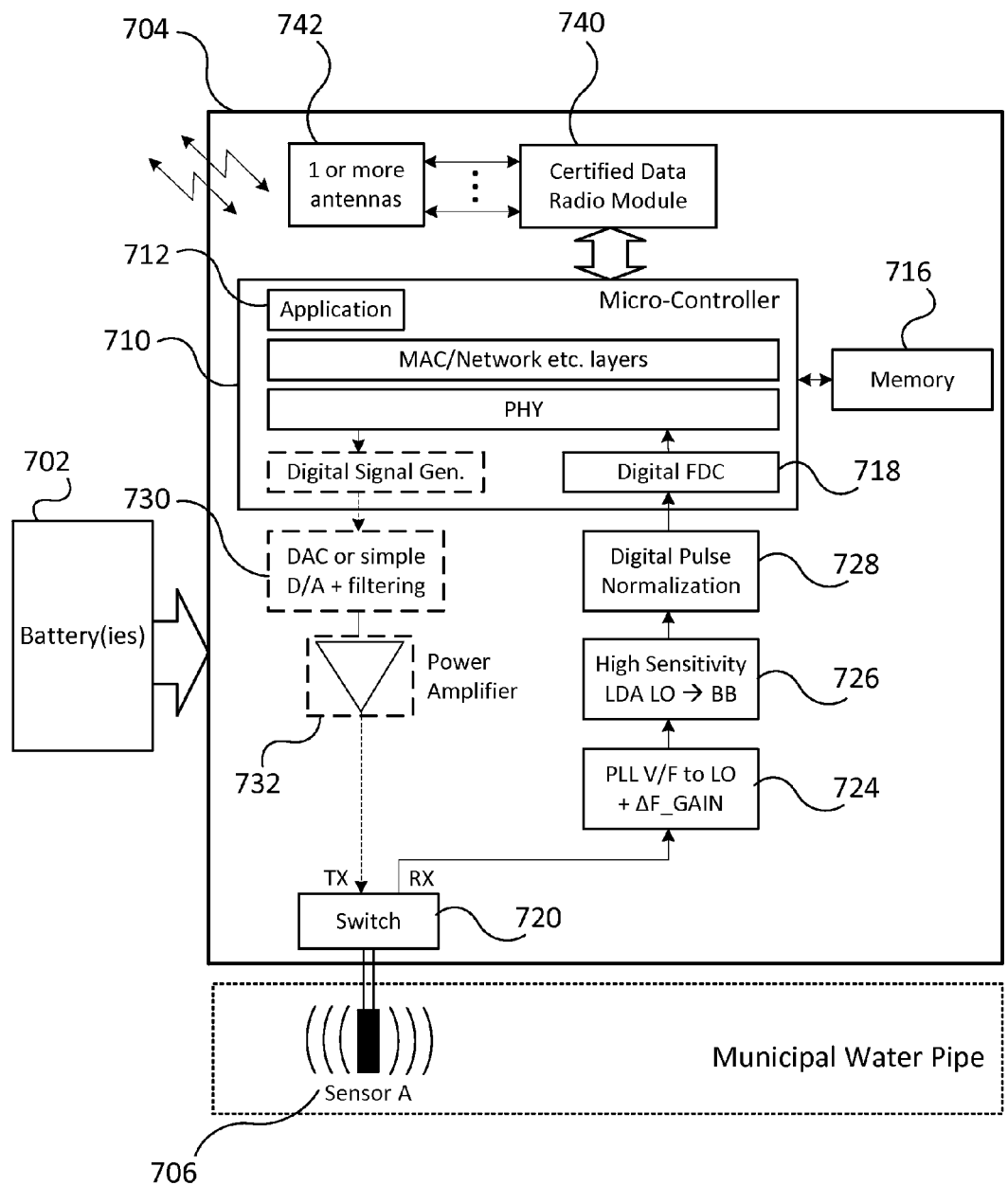
FIG. 7 illustrates a second embodiment of a block schematic diagram for the water leak detector of FIG. 5.

FIG. 7 illustrates a further embodiment of leak detection unit 700. The battery 702 provides power to the hardware unit 704, which is connected to a sensor 706. The hardware unit 704 includes a micro-controller or central processing unit 710 that operates one or more applications 712, such as communications applications, water leak processing applications, operating in conjunction with memory 716. The micro-controller 710 may also include an analog frequency to digital frequency converter (FDC) 718.

In operation, sensor 706 may be an acoustic detector or sensor/transducer (all referred to as "sensors" herein) that may operate in transmit (TX) and receive (RX) mode, or just RX mode, e.g., 20 Hz to 5 KHz. In RX mode, the sensor 706 may include one or more piezoelectric crystals that generate a voltage when force, such as sound or pressure, is applied to them. In TX mode, the piezoelectric crystals of the sensor 706 may change size when a voltage is applied across them causing them to oscillate at very high frequencies, thereby producing sound waves, e.g., 10 Hz to 10 KHz. Voltage signals generated by the sensor 706 are input to a switch 720 that outputs the received signal PLL 724, which performs a voltage to frequency conversion and gain (KHz/mV) of the received signal to an intermediate frequency (V/F to LO (intermediate frequency)+ΔF_Gain), without voltage amplification, and outputs the frequency modulated signal to the log detection converter/log detector amplifier (LDA) 726, which demodulates that frequency modulated signal at the intermediate frequency to generate an amplified pulsed output signal without a voltage gain or added noise. The amplified pulsed output signal is then shaped by the digital pulse normalization circuit 728 to create a digital-like output signal, which is then converted to a digital signal by FDC 718 so that the data signal can be processed by the water leak processing application 714 and any other applications 712 of the micro-controller 710.

The micro-controller 710 outputs a digital signal that includes data indicative of any leak detected by the sensor 706, which is then converted to an analog signal by a digital to analog converter (DAC) 730, which is then amplified by a power amplifier 732. Switch 720 may then route the amplified data signal to sensor 706 is being utilized to transmit the amplified data signal through the water medium as a means of communication. If sensor 706 is not a transmitter, the unit 700 may further include a certified data radio module 740 connected to one or more antennas 742. The data radio module 740 may include all of the circuitry and software necessary, such as RF TX, RX, ADCs, intermediate frequency synthesizers, physical layers, communication layers, memory, etc., and may communicate with any of a number of different types of fixed networks, such as a cellular wide area network (WAN), a cellular picocell network of end user subscribers, a cellular microcell network of super-user subscribers, an augmented WIFI network of super-user subscribers, a proprietary fixed wide local area network (WLAN), or an infrastructure provider network on private or ISM band (industrial, scientific and medical radio bands)

Figure 8:
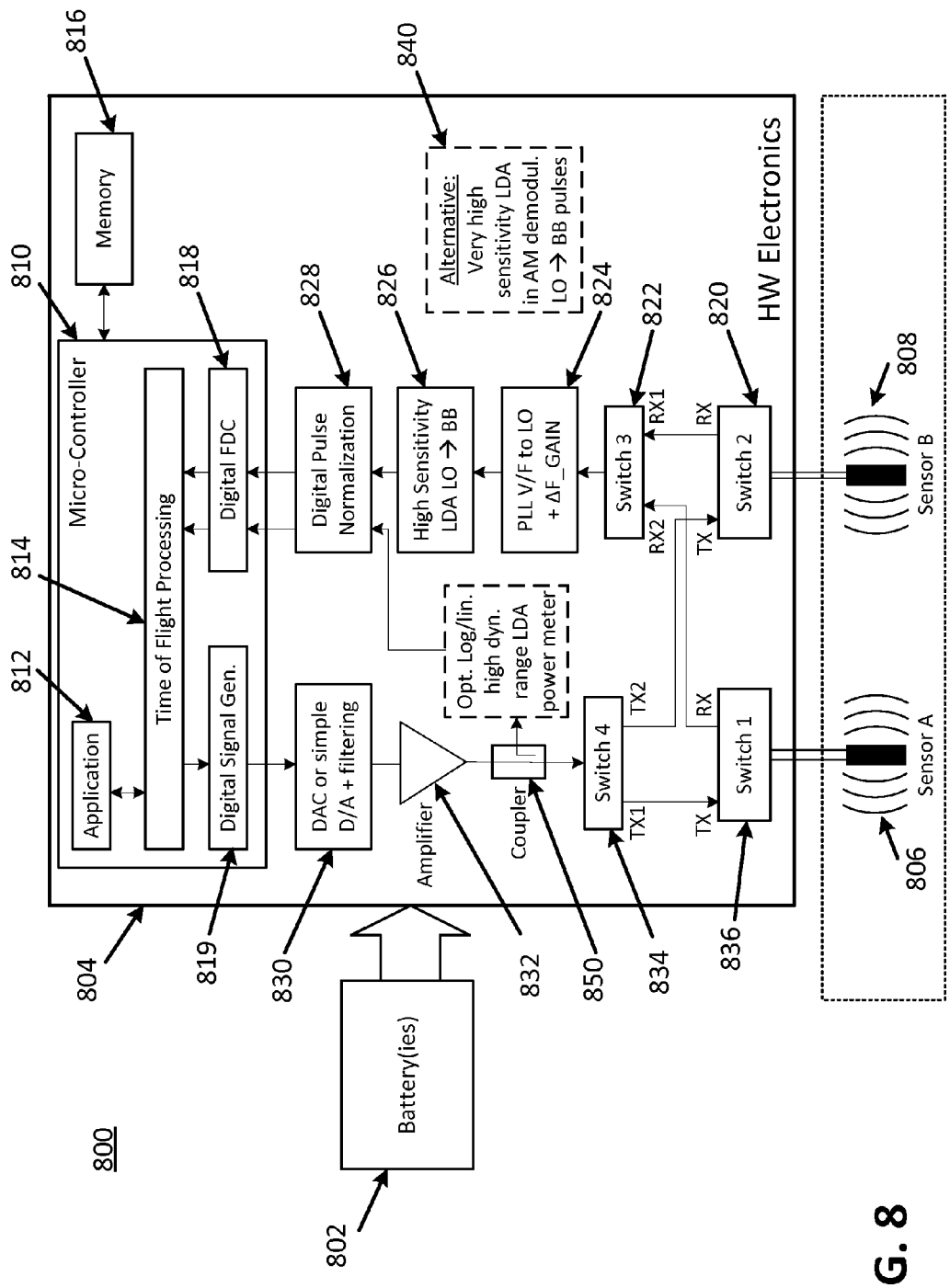
FIG. 8 illustrates an embodiment of an implementation in a water flow meter.

FIG. 8 illustrates another embodiment of an implementation of the low noise detection system of the present disclosure. The implementation is for liquid flow rate monitoring unit 800. As already illustrated and described in relation to FIG. 7, the battery 802 provides power to the hardware unit 804, which is connected to two sensors 806 and 808. The hardware unit 804 includes micro-controller 810 that operates one or more applications 812, including time of flight processing application 814, operating in conjunction with memory 816. The micro-controller 810 may include FDC 818 and a digital signal generator 819. In FIG. 8, sensors 806 and 808 may both be acoustic sensor, with sensor 806 operating in TX/RX mode and sensor 808 operating in RX/TX mode, the point of which will be further explained below. The target receive sensitivity of the unit 800 is approximately −125 dBm and a sufficient power level may be achieved with TX equal to 100 mW.

As described with respect to FIG. 7, in FIG. 8, voltage signals generated by the sensor 808 are input to a switch 820 that outputs the received signal to a second switch 822. The output from switch 822 is received by PLL 824, which converts the signal and outputs a frequency modulated signal to the LDA 826. The amplified pulsed output signal from the LDA 826 is then shaped by the digital pulse normalization circuit 828 and then processed by the time or flight processing application 814 and any other applications 812 of the micro-controller 810. Digital signals including data indicative of the flow rate of liquid, gas or other materials in the pipe 801, are output by the micro-controller 810, converted to analog signals by DAC 830, and routed by switch 834 to either switch 836 or switch 820. The switches 820, 822, 834 and 836 may be replace by any similar switch system, such as a switch matrix, a single double pull, double throw (DTDP) with two ins and two outs. As noted above, the unit 800 operates as a flow meter, which also requires voltage signals from sensor 806 to be routed from switch 836 to switch 822 so voltage signals from sensor 806 can be processed in the same manner as voltage signals from sensor 808, and for signals to be transmitted by sensor 808 in the same manner as sensor 806.

As illustrated in FIG. 8, the flow meter operates using time of flight calculations. The flow rate of the liquid, gas or other material in the pipe 801 flowing in one direction, say from sensor 806 to sensor 808 may produce a faster signal from 806 to 808 than from the opposite direction of sensor 808 to sensor 806 due to the speed of the material in the pipe 801. Hence, the time taken by the signal from sensor 806 to sensor 808 minus the time from sensor 808 to sensor 806 may be proportional to the speed of the liquid. For example, if the distance from sensor 806 to sensor 808 is D, then the liquid velocity $V_L$ may be $V_L=K*(D/t_0)*(\Delta t/t_0)$, where $t_0$ is the propagation time from sensor 806 to sensor 808 when $V_L=0$ and $\Delta t$ is the change in time due to liquid flow.

Figure 9:
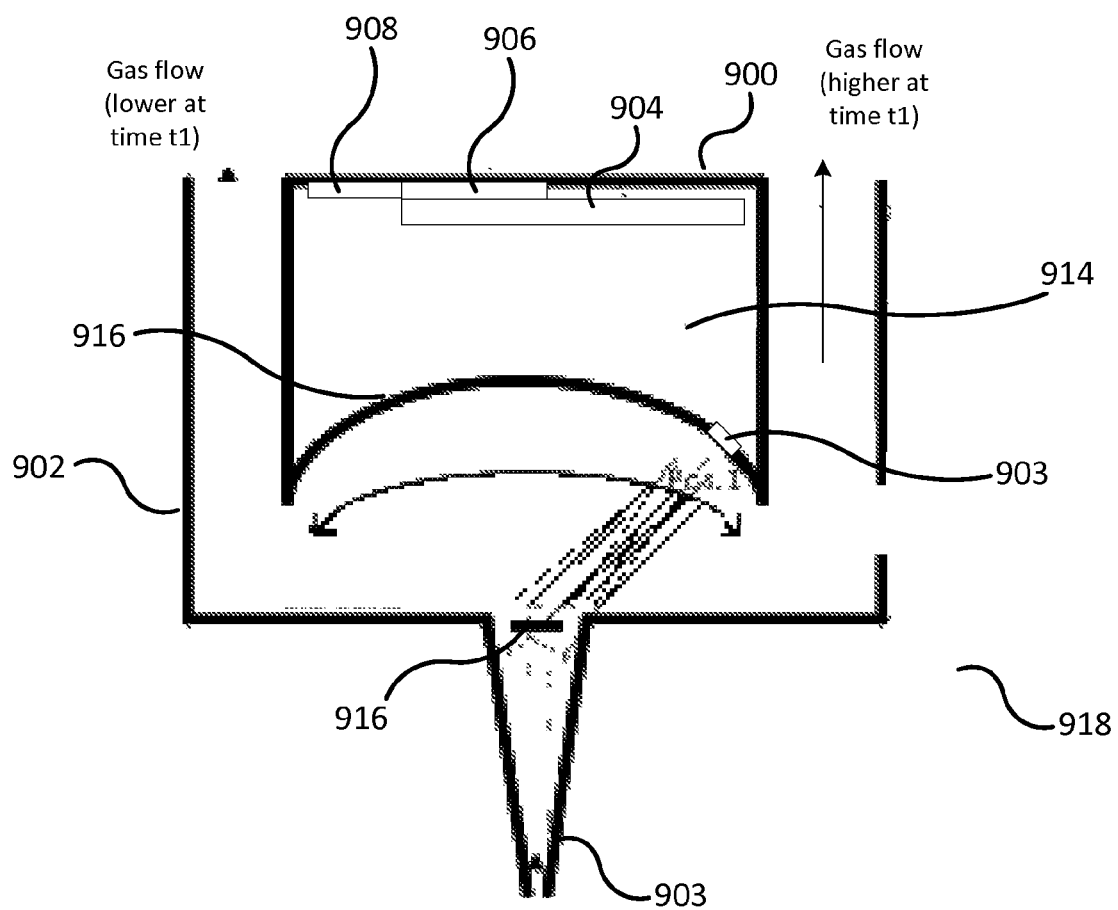
FIG. 9 illustrates an embodiment of an implementation in a gas flow meter.
Figure 10:
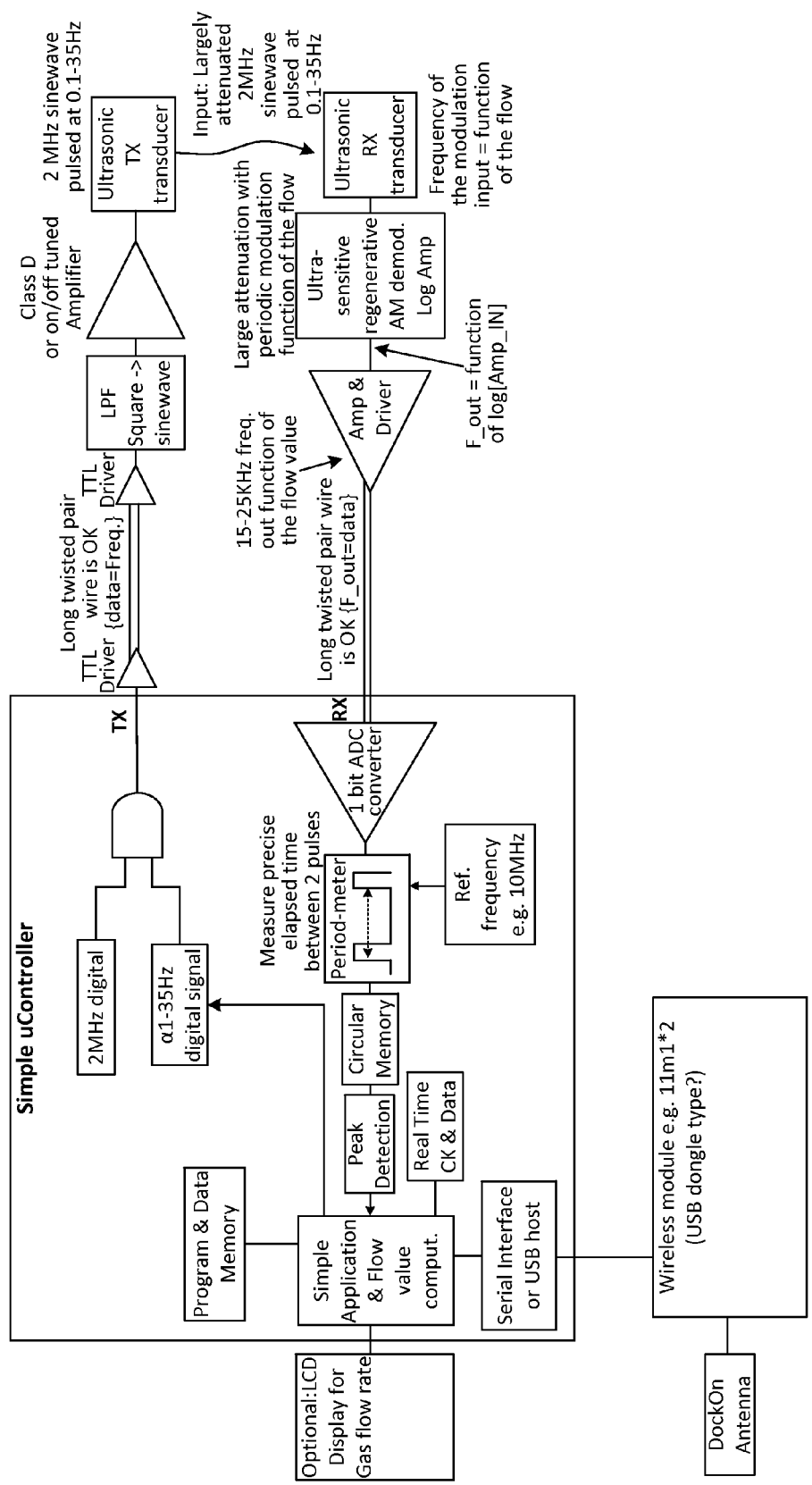
FIG. 10 illustrates an embodiment of a block schematic diagram for the gas flow meter of FIG. 9.

FIG. 9 illustrates another embodiment of an implementation of the low noise detection system of the present disclosure where the implementation is for gas flow rate monitoring unit 900. Unit 900 is installed in a gas valve or pipe 902 having a gas inlet 903 and consists of a main PCB 904 that includes all of the flow rate monitoring circuitry, an RF communication module 906 and an antenna 908, all mounted within unit 900, installed within the pipe 902. The bottom of the unit 900 has a curved surface 910 on which is mounted ultrasonic receiver 912, connected to the main PCB 904 by cable 914. An ultrasonic transmitter 916 mounted within the inlet 903 and connected to the main PCB 904 by cable 918 transmits a 2 MHz pulsed ultrasonic signal as the gas flows into pipe 902 through the inlet 903 and strikes the curved surface 910, where the gas oscillates between 0.1 to 35 Hz as it moves around the curved surface and into the rest of the pipe. The ultrasonic receiver 912 detects the pulsed transmitted signal and relays that signal to the main PCB 904 for processing in accordance with the embodiments described above. The benefits of such an implementation are that it has high sensitivity, while consuming little power, it has a high noise rejection and flexible high accuracy/resolution. In this implementation there is no need for analog to digital n bits conversion and the topology is simple and affordable. FIG. 10 provides a block circuit diagram illustrating the implementation illustrated in FIG. 9.

As noted above, industrial environments can be very noisy or otherwise make it difficult to utilize wireless communications because of ambient noise, RF interference, metallic partitions, moving equipment, etc., or just because the resulting wireless signals are relatively weak. By amplifying wanted wireless signals in such environments without amplifying the noise, a low noise detection system as described herein can be very useful. Other wireless applications in which the low noise detection system described herein can be desirably used include wireless communications applications that benefit from high receive sensitivity, direct analog or digital amplitude and frequency modulation AM/FM discrimination, high dynamic range, and high interference rejection. The low noise detection system described herein may be desirably utilized below 1 GHz, such as 169 MHz, 433 MHz, 868 MHz, 920 MHz, or above 1 GHz, such as 2.4 GHz, 5-6 GHz, etc., and in short range applications, such as BLUETOOTH and other personal area networks (PANs), WirelessHD and WiGig operating over the unlicensed 60 GHz spectrum, or wireless local area networks (WLAN) using analog or digital AM and FM modulations.

FIG. 11A illustrates an implementation of a wireless communication system that includes the low noise detection system of the present disclosure. In FIG. 11A, the wireless transmitter 1100 modulates a signal (through PLL/VCO 1102) to be transmitted at some specified frequency, only some of which are listed in FIG. 11A, to receiver 1104, which includes LDA 1106 that demodulates the signal and other circuitry 1108 that finishes processing the now amplified and noise reduced signal.

Due to the high receive sensitivity of the low noise detection system described herein, the regeneration of data signals without significant noise, intrinsic AM demodulation, and other factors, various medical applications may benefit using the technology, including ultrasonic monitoring, such as for blood pressure and pulse rate, magnetic resonance imaging, sonography, such ultrasonic fetus examination. FIG. 11B illustrates one such example where the wireless transmitter 1120 modulates a signal (through PLL/VCO 1122) to be transmitted at some specified frequency at a patient 1121. That signal may pass through or be reflected by the patient's tissue to receiver 1124, which includes LDA 1126 that demodulates the signal and other circuitry 1128 that finishes processing the now amplified and noise reduced signal.

FIGS. 11C and 11D illustrate two further implementations of the low noise detection system of the present disclosure. In FIG. 11C, a wearable device such as a GPS receiver, smart phone or other device, where high receive sensitivity and low noise amplification are needed, may receive or generate a signal that has been modulated by a PLL/VCO at the source (not shown) at some specified frequency at receiver 1130, which includes LDA 1134 that demodulates the signal and other circuitry 1136 that finishes processing the now amplified and noise reduced signal. In a smart phone, the low noise detection system may be used to improve phone voice quality at reception, and also in transmission, by applying the same low noise detection technology on the transmitter side. The present technology may also be implemented on signals generated within the device, such as by accelerometers within the smart phone. For example, by measuring an accelerometer in a smart phone with higher sensitivity, the path of a person can be determined without the use of other positioning infrastructure, such as GPS, ranging or other sensors.

Similar gains can be achieved with radio frequency identification (RFID) devices as illustrated in FIG. 11D. A typical limitation of RFID devices is that they have a short range of communication, which can make it difficult to use them for security and object tracking, such as when RFID devices are affixed to clothing or goods in stores. An RFID device that incorporates the low noise detection technology described herein, could have extended range because of the higher sensitivity, while having a relatively simple topology and lower power consumption, making it still possible to power the RFID device from the received signal. For example, the RFID transceiver 1140 could transmit a signal modulated by the PLL/VCO 1141 that is detected by the coil 1142 of the RFID transponder 1144. The coil 1142 would power the transponder 1144 and its circuitry from the received signal, which would be input to the LDA 1146, which would then demodulate the signal and other circuitry 1148, which may include the memory and the data to be transmitted back to the RFID transceiver 1140, would finish processing the now amplified and noise reduced signal.

Figure 12:
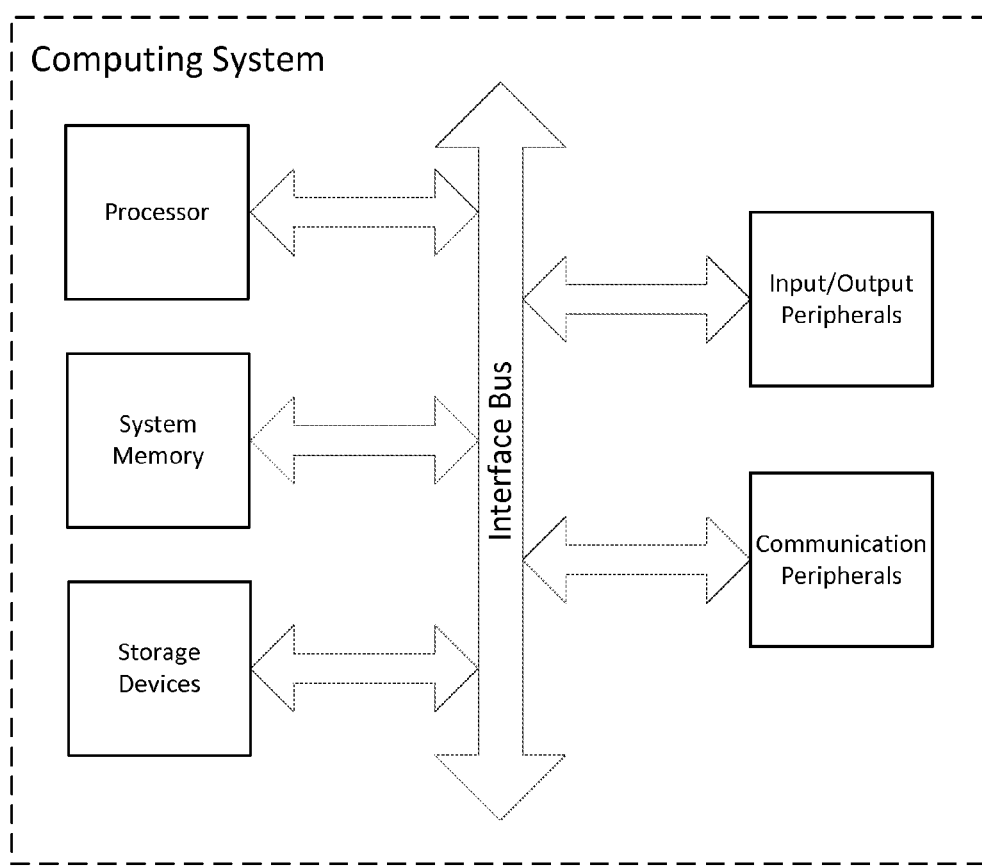
FIG. 12 a block diagram of a computing system.

The techniques described above may be implemented on a computing device, a plurality of computing devices, a server in communication with the computing device(s), or a plurality of servers in communication with the computing device(s). Additionally, the techniques may be distributed between the computing device(s) and the server(s). For example, the computing device may collect and transmit raw data to the server that, in turn, processes the raw data. FIG. 12 illustrates an exemplary block diagram of a computing system that includes hardware modules, software module, and a combination thereof and that can be implemented as the computing device and/or as the server.

In a basic configuration, the computing system may include at least a processor, a system memory, a storage device, input/output peripherals, communication peripherals, and an interface bus. The interface bus is configured to communicate, transmit, and transfer data, controls, and commands between the various components of the electronic device. The system memory and the storage device comprise computer readable storage media, such as RAM, ROM, EEPROM, hard-drives, CD-ROMs, optical storage devices, magnetic storage devices, flash memory, and other tangible storage media. Any of such computer readable storage medium can be configured to store instructions or program codes embodying aspects of the disclosure. Additionally, the system memory comprises an operation system and applications. The processor is configured to execute the stored instructions and can comprise, for example, a logical processing unit, a microprocessor, a digital signal processor, and the like.

The system memory and the storage device may also comprise computer readable signal media. A computer readable signal medium may include a propagated data signal with computer readable program code embodied therein. Such a propagated signal may take any of variety of forms including, but not limited to, electro-magnetic, optical, or any combination thereof. A computer readable signal medium may be any computer readable medium that is not a computer readable storage medium and that can communicate, propagate, or transport a program for use in connection with the computing system.

Further, the input and output peripherals include user interfaces such as a keyboard, screen, microphone, speaker, other input/output devices, and computing components such as digital-to-analog and analog-to-digital converters, graphical processing units, serial ports, parallel ports, and universal serial bus. The input/output peripherals may be connected to the processor through any of the ports coupled to the interface bus.

The user interfaces can be configured to allow a user of the computing system to interact with the computing system. For example, the computing system may include instructions that, when executed, cause the computing system to generate a user interface that the user can use to provide input to the computing system and to receive an output from the computing system.

This user interface may be in the form of a graphical user interface that is rendered at the screen and that is coupled with audio transmitted on the speaker and microphone and input received at the keyboard. In an embodiment, the user interface can be locally generated at the computing system. In another embodiment, the user interface may be hosted on a remote computing system and rendered at the computing system or on a remote tablet, smart phone, remote terminal, web terminal, etc. For example, the server may generate the user interface and may transmit information related thereto to the computing device that, in turn, renders the user interface to the user. The computing device may, for example, execute a browser or an application that exposes an application program interface (API) at the server to access the user interface hosted on the server.

Finally, the communication peripherals of the computing system are configured to facilitate communication between the computing system and other computing systems (e.g., between the computing device and the server) over a communications network. The communication peripherals include, for example, a network interface controller, modem, various modulators/demodulators and encoders/decoders, wireless and wired interface cards, antenna, and the like.

The communication network includes a network of any type that is suitable for providing communications between the computing device and the server and may comprise a combination of discrete networks which may use different technologies. For example, the communications network includes a cellular network, a WiFi/broadband network, a local area network (LAN), a wide area network (WAN), a telephony network, a fiber-optic network, or combinations thereof. In an example embodiment, the communication network includes the Internet and any networks adapted to communicate with the Internet. The communications network may be also configured as a means for transmitting data between the computing device and the server.

The techniques described above may be embodied in, and fully or partially automated by, code modules executed by one or more computers or computer processors. The code modules may be stored on any type of non-transitory computer-readable medium, specifically excluding signals, or computer storage device, such as hard drives, solid state memory, optical disc, and/or the like. The processes and algorithms may be implemented partially or wholly in application-specific circuitry. The results of the disclosed processes and process steps may be stored, persistently or otherwise, in any type of non-transitory computer storage such as, e.g., volatile or non-volatile storage.

The various features and processes described above may be used independently of one another, or may be combined in various ways. All possible combinations and sub-combinations are intended to fall within the scope of this disclosure. In addition, certain method or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed example embodiments. The example systems and components described herein may be configured differently than described. For example, elements may be added to, removed from, or rearranged compared to the disclosed example embodiments.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements, and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

In an embodiment, a low noise detection system comprises a transmitter including a modulator configured to convert a voltage signal indicative of data to a frequency signal, to modulate a baseband signal with the data, and to transmit the modulated data signal; a receiver including a log detection amplifier configured to receive the modulated data signal and to regeneratively demodulate the modulated data signal to extract the data in an amplified analog data signal while not significantly amplifying any noise in the modulated data signal; and a digital conversion circuit for converting the amplified analog signal into a digital data signal.

In the embodiment, the transmitter includes an oscillator configured to provide the modulator within an intermediate frequency signal for AM modulation and the modulator is configured to AM modulate the baseband signal with the data. In the embodiment, the modulator includes a phase lock loop (PLL) for FM modulating the baseband signal with the data. In the embodiment, the modulator includes a voltage controller oscillator (VCO) for FM modulating the baseband signal with the data. In the embodiment, the log detection amplifier includes a frequency to voltage converter configured to convert the amplified analog signal into an output voltage signal including the data. In that embodiment, the digital conversion circuit includes an N-bits analog to digital converter configured to convert the amplified analog signal into an output digital signal including the data.

In the embodiment, the digital conversion circuit includes an N-bit counter with a fast clock, a 1/N digital inverse function and a scaling circuit configured to convert the amplified analog signal into an output digital signal including the data. In the embodiment, the modulator is configured to modulate the baseband signal with a frequency tone of approximately 40 dB of high spectral purity. In the embodiment, the transmitter is a wireless transmitter operating at above or below 1 GHz and the receiver is a wireless receiver. In the embodiment, the transmitter is a medical transmission device configured to transmit the modulated data signal at a patient and the receiver is a medical receiver device configured to receive the modulated data signal passing through or being reflected by the patient, and wherein the data represents information about the patient's medical condition. In the embodiment, the transmitter is a wireless transmitter and the receiver is a wireless receiver within a user wearable device. In that embodiment, the data includes a voice signal. In that embodiment, the receiver further includes a second transmitter including a second modulator configured to convert a second voltage signal indicative of second data to a second frequency signal, to modulate a second baseband signal with the second data, and to transmit the second modulated data signal, and wherein the second data includes voice signals received by a microphone of the receiver.

In the embodiment, the transmitter is a RFID transceiver and the receiver is installed within a RFID transponder including a coil for powering the RFID transponder based on the modulated data signal and a transmitter for transmitting a code stored in a memory of the RFID transponder back to the RFID transceiver.

In the embodiment, the transmitter and the receiver are installed in a leak detector device including an ultrasonic detector configured to monitor sound or pressure in a fluid within pipe indicative of a leak of the material from the pipe.

In the embodiment, the transmitter and the receiver are installed in a flow rate monitoring device including two or more acoustic detectors configured to monitor material within a pipe indicative of a flow rate of the material.

In the embodiment, the baseband signal is a microvolt signal.

In an embodiment, a low noise detection system comprises a transmitter configured to transmit a baseband signal including a voltage data signal, and a receiver including a modulator configured to convert the voltage data signal to a frequency signal, to modulate the baseband signal with the voltage data, while not significantly amplifying noise and to output a modulated data signal, the receiver further including a log detection amplifier configured to receive the modulated data signal and to demodulate the modulated data signal to extract the data in an amplified analog data signal, and the receiver further including a digital conversion circuit for converting the amplified analog signal into a digital data signal.

In the embodiment, the log detection amplifier is configured to demodulate the modulated data signal concurrently in both AM and FM modes. In the embodiment, the receiver includes an oscillator configured to provide the modulator within an intermediate frequency signal for AM modulation and the modulator is configured to AM modulate the baseband signal based on the intermediate frequency signal with the data signal. In the embodiment, the modulator includes a phase lock loop (PLL) for FM modulating the baseband signal with the data signal. In the embodiment, the modulator includes a voltage controller oscillator (VCO) for FM modulating the baseband signal with the data signal. In the embodiment, the log detection amplifier includes a frequency to voltage converter configured to convert the amplified analog signal into an output voltage signal including data from the data signal. In that embodiment, the digital conversion circuit includes an N-bits analog to digital converter configured to convert the amplified analog signal into an output digital signal including data from the data signal.

In the embodiment, the digital conversion circuit includes a N-bit counter with fast clock, a 1/N digital inverse function and a scaling circuit configured to convert the amplified analog signal into an output digital signal including data from the data signal. In the embodiment, the modulator is configured to modulate the baseband signal with a frequency tone of approximately 40 dB of high spectral purity. In the embodiment, the transmitter is a wireless transmitter operating at above or below 1 GHz and the receiver is a wireless receiver. In the embodiment, the transmitter is a medical transmission device configured to transmit the baseband signal at a patient and the receiver is a medical receiver device configured to receive the baseband signal passing through or being reflected by the patient so as to include the data representing information about the patient's medical condition. In the embodiment, the transmitter is a medical baseband signal issued at a patient and the receiver is a medical receiver device configured to receive the baseband signal issued from the patient so as to include the data representing information about the patient's medical condition. In the embodiment, the transmitter is a wireless transmitter and the receiver is a wireless receiver within a user wearable device. In that embodiment, the data includes a voice signal. In that embodiment, the receiver further includes a second transmitter including a second modulator configured to convert a second voltage signal indicative of second data to a second frequency signal, to modulate a second baseband signal with the second data, and to transmit the second modulated data signal, and wherein the second data includes voice signals received by a microphone of the receiver.

In the embodiment, the transmitter is a RFID transceiver and the receiver is installed within a RFID transponder including a coil for powering the RFID transponder based on the baseband signal and a transmitter for transmitting a code stored in a memory of the RFID transponder back to the RFID transceiver. In the embodiment, the transmitter and the receiver are installed in a leak detector device including an acoustic detector configured to monitor sound or pressure in a fluid within pipe indicative of a leak of the material from the pipe. In the embodiment, the transmitter and the receiver are installed in a flow rate monitoring device including two or more acoustic detectors configured to monitor material within a pipe indicative of a flow rate of the material. In the embodiment, the baseband signal is a microvolt signal.

While certain example embodiments have been described, these embodiments have been presented by way of example only, and are not intended to limit the scope of the inventions disclosed herein. Thus, nothing in the foregoing description is intended to imply that any particular feature, characteristic, step, module, or block is necessary or indispensable. Indeed, the novel methods and systems described herein may be embodied in a variety of other forms; furthermore, various omissions, substitutions and changes in the form of the methods and systems described herein may be made without departing from the spirit of the inventions disclosed herein. The accompanying claims and their equivalents are intended to cover such forms or modifications as would fall within the scope and spirit of certain of the inventions disclosed herein.

What is claimed:
1. A low noise detection system, comprising:
   a transmitter including a modulator configured to convert a voltage signal indicative of data to a frequency signal, to modulate a baseband signal with the data, and to transmit the modulated data signal, wherein the transmitter comprises a RFID transceiver;
   a receiver including a log detection amplifier configured to receive the modulated data signal and to regeneratively demodulate the modulated data signal to extract the data in an amplified analog data signal while not significantly amplifying any noise in the modulated data signal, wherein the receiver is installed within a RFID transponder including a coil for powering the RFID transponder based on the modulated data signal and a transmitter for transmitting a code stored in a memory of the RFID transponder back to the RFID transceiver; and a digital conversion circuit for converting the amplified analog signal into a digital data signal.

2. The low noise detection system of claim 1, wherein the transmitter includes an oscillator configured to provide the modulator within an intermediate frequency signal for AM modulation and the modulator is configured to AM modulate the baseband signal with the data.

3. The low noise detection system of claim 1, wherein the modulator includes a phase lock loop (PLL) for FM modulating the baseband signal with the data.

4. The low noise detection system of claim 1, wherein the modulator includes a voltage controller oscillator (VCO) for FM modulating the baseband signal with the data.

5. The low noise detection system of claim 1, wherein the log detection amplifier includes a frequency to voltage converter configured to convert the amplified analog signal into an output voltage signal including the data.

6. The low noise detection system of claim 5, wherein the digital conversion circuit includes an N-bits analog to digital converter configured to convert the amplified analog signal into an output digital signal including the data.

7. The low noise detection system of claim 1, wherein the digital conversion circuit includes a N-bit counter with a fast clock, a 1/N digital inverse function and a scaling circuit configured to convert the amplified analog signal into an output digital signal including the data.

8. The low noise detection system of claim 1, wherein the modulator is configured to modulate the baseband signal with a frequency tone of approximately 40 dB of high spectral purity.

9. The low noise detection system of claim 1, wherein the transmitter is a wireless transmitter operating at above or below 1 GHz and the receiver is a wireless receiver.

10. The low noise detection system of claim 1, wherein the transmitter is a medical transmission device configured to transmit the modulated data signal at a patient and the receiver is a medical receiver device configured to receive the modulated data signal passing through or being reflected by the patient, and wherein the data represents information about the patient's medical condition.

11. The low noise detection system of claim 1, wherein the transmitter is a wireless transmitter and the receiver is a wireless receiver within a user wearable device.

12. The low noise detection system of claim 11, wherein the data includes a voice signal.

13. The low noise detection system of claim 11, wherein the receiver further includes a second transmitter including a second modulator configured to convert a second voltage signal indicative of second data to a second frequency signal, to modulate a second baseband signal with the second data, and to transmit the second modulated data signal, and wherein the second data includes voice signals received by a microphone of the receiver.

14. The low noise detection system of claim 1, wherein the transmitter and the receiver are installed in a leak detector device including an ultrasonic detector configured to monitor sound or pressure in a fluid within pipe indicative of a leak of the material from the pipe.

15. The low noise detection system of claim 1, wherein the transmitter and the receiver are installed in a flow rate monitoring device including two or more acoustic detectors configured to monitor material within a pipe indicative of a flow rate of the material.

16. The low noise detection system of claim 1, wherein the baseband signal is a microvolt signal.

17. A low noise detection system, comprising:

a transmitter configured to transmit a baseband signal including a voltage data signal wherein the transmitter is a RFID transceiver; and a receiver including a modulator configured to convert the voltage data signal to a frequency signal, to modulate the baseband signal with the voltage data, while not significantly amplifying noise and to output a modulated data signal, the receiver further including a log detection amplifier configured to receive the modulated data signal and to demodulate the modulated data signal to extract the data in an amplified analog data signal, and the receiver further including a digital conversion circuit for converting the amplified analog signal into a digital data signal, wherein the receiver is installed within a RFID transponder including a coil for powering the RFID transponder based on the baseband signal and a transmitter for transmitting a code stored in a memory of the RFID transponder back to the RFID transceiver.

18. The low noise detection system of claim 17, wherein the log detection amplifier is configured to demodulate the modulated data signal concurrently in both AM and FM modes.

19. The low noise detection system of claim 17, wherein the receiver includes an oscillator configured to provide the modulator within an intermediate frequency signal for AM modulation and the modulator is configured to AM modulate the baseband signal based on the intermediate frequency signal with the data signal.

20. The low noise detection system of claim 17, wherein the modulator includes a phase lock loop (PLL) for FM modulating the baseband signal with the data signal.

21. The low noise detection system of claim 17, wherein the modulator includes a voltage controller oscillator (VCO) for FM modulating the baseband signal with the data signal.

22. The low noise detection system of claim 17, wherein the log detection amplifier includes a frequency to voltage converter configured to convert the amplified analog signal into an output voltage signal including data from the data signal.

23. The low noise detection system of claim 22, wherein the digital conversion circuit includes an N-bits analog to digital converter configured to convert the amplified analog signal into an output digital signal including data from the data signal.

24. The low noise detection system of claim 17, wherein the digital conversion circuit includes a N-bit counter with fast clock, a 1/N digital inverse function and a scaling circuit configured to convert the amplified analog signal into an output digital signal including data from the data signal.

25. The low noise detection system of claim 17, wherein the modulator is configured to modulate the baseband signal with a frequency tone of approximately 40 dB of high spectral purity.

26. The low noise detection system of claim 17, wherein the transmitter is a wireless transmitter operating at above or below 1 GHz and the receiver is a wireless receiver.

27. The low noise detection system of claim 17, wherein the transmitter is a medical transmission device configured to transmit the baseband signal at a patient and the receiver is a medical receiver device configured to receive the baseband signal passing through or being reflected by the patient so as to include the data representing information about the patient's medical condition.

28. The low noise detection system of claim 17, wherein the transmitter is a medical baseband signal issued at a patient and the receiver is a medical receiver device configured to receive the baseband signal issued from the patient so as to include the data representing information about the patient's medical condition.

29. The low noise detection system of claim 17, wherein the transmitter is a wireless transmitter and the receiver is a wireless receiver within a user wearable device.

30. The low noise detection system of claim 29, wherein the data includes a voice signal.

31. The low noise detection system of claim 29, wherein the receiver further includes a second transmitter including a second modulator configured to convert a second voltage signal indicative of second data to a second frequency signal, to modulate a second baseband signal with the second data, and to transmit the second modulated data signal, and wherein the second data includes voice signals received by a microphone of the receiver.

32. The low noise detection system of claim 17, wherein the transmitter and the receiver are installed in a leak detector device including an acoustic detector configured to monitor sound or pressure in a fluid within pipe indicative of a leak of the material from the pipe.

33. The low noise detection system of claim 17, wherein the transmitter and the receiver are installed in a flow rate monitoring device including two or more acoustic detectors configured to monitor material within a pipe indicative of a flow rate of the material.

34. The low noise detection system of claim 17, wherein the baseband signal is a microvolt signal.

* * * * *